US012736715B2

(12) United States Patent
Takahashi et al.

(10) Patent No.: US 12,736,715 B2
(45) Date of Patent: Sep. 15, 2026

(54) SOLID-STATE IMAGING DEVICE, METHOD FOR MANUFACTURING COVER GLASS, AND ELECTRONIC APPARATUS

(71) Applicant: SONY SEMICONDUCTOR SOLUTIONS CORPORATION, Kanagawa (JP)

(72) Inventors: Katsunori Takahashi, Kumamoto (JP); Shoichi Hirooka, Kumamoto (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 364 days.

(21) Appl. No.: 18/548,268

(22) PCT Filed: Feb. 25, 2022

(86) PCT No.: PCT/JP2022/007956

§ 371 (c)(1),
(2) Date: Aug. 29, 2023

(87) PCT Pub. No.: WO2022/186079

PCT Pub. Date: Sep. 9, 2022

(65) Prior Publication Data

US 2024/0134089 A1 Apr. 25, 2024
US 2024/0230958 A9 Jul. 11, 2024

(30) Foreign Application Priority Data

Mar. 5, 2021 (JP) ................................ 2021-035856

(51) Int. Cl.
*G02B 1/118* (2015.01)
*H04N 25/61* (2023.01)
(Continued)

(52) U.S. Cl.
CPC ............ *G02B 1/118* (2013.01); *H04N 25/61* (2023.01); *H04N 25/62* (2023.01); (Continued)

(58) Field of Classification Search
CPC ........ G02B 1/118; H04N 25/61; H04N 25/62; H10F 39/024; H10F 39/12; H10F 39/8053; H10F 39/8063; H10F 39/811
See application file for complete search history.

(56) References Cited

U.S. PATENT DOCUMENTS

2010/0128350 A1 5/2010 Findlay et al.
2010/0244169 A1 9/2010 Maeda et al.
(Continued)

FOREIGN PATENT DOCUMENTS

JP 2010-041941 2/2010
JP 2010-239003 10/2010
(Continued)

OTHER PUBLICATIONS

Translation of WO2016009826 (Year: 2016).*
(Continued)

*Primary Examiner* — Mark R Gaworecki
(74) *Attorney, Agent, or Firm* — SHERIDAN ROSS P.C.

(57) ABSTRACT

A solid-state imaging device with high versatility having a cavity-less CSP structure capable of reducing the occurrence of flare and also being applied to chip size reduction, a method for manufacturing a cover glass, and an electronic apparatus. A solid-state imaging device includes: a sensor substrate in which a plurality of pixels is arranged; a semiconductor substrate having an upper surface on which the sensor substrate is mounted, the semiconductor substrate being configured to connect an electric signal converted by the pixel to a bump or an external connection terminal disposed on a lower surface; a microlens array disposed on an upper surface of the sensor substrate; a resin disposed on an upper surface of the microlens array; and a cover glass bonded to the microlens array via the resin and having a moth-eye structure on a surface of the cover glass.

20 Claims, 12 Drawing Sheets

(51) Int. Cl.

| | |
|---|---|
| ***H04N 25/62*** | (2023.01) |
| ***H10F 39/00*** | (2025.01) |
| ***H10F 39/10*** | (2025.01) |
| ***H10F 39/12*** | (2025.01) |

(52) U.S. Cl.
CPC ........... *H10F 39/024* (2025.01); *H10F 39/12* (2025.01); *H10F 39/8053* (2025.01); *H10F 39/8063* (2025.01); *H10F 39/811* (2025.01)

(56) References Cited

U.S. PATENT DOCUMENTS

| | | | | |
|---|---|---|---|---|
| 2016/0370505 | A1 | 12/2016 | Koo et al. | |
| 2018/0305552 | A1* | 10/2018 | Matsumura | G03F 7/322 |
| 2019/0043910 | A1 | 2/2019 | Miyazawa et al. | |

FOREIGN PATENT DOCUMENTS

| | | | | |
|---|---|---|---|---|
| JP | 2013-038164 | | 2/2013 | |
| WO | WO-2016009826 | A1 * | 1/2016 | G02B 1/111 |
| WO | WO 2017/163926 | | 9/2017 | |

OTHER PUBLICATIONS

International Search Report and Written Opinion prepared by the Japan Patent Office on May 2, 2022, for International Application No. PCT/JP2022/007956, 2 pgs.

* cited by examiner

FIG. 9A
FIG. 9B
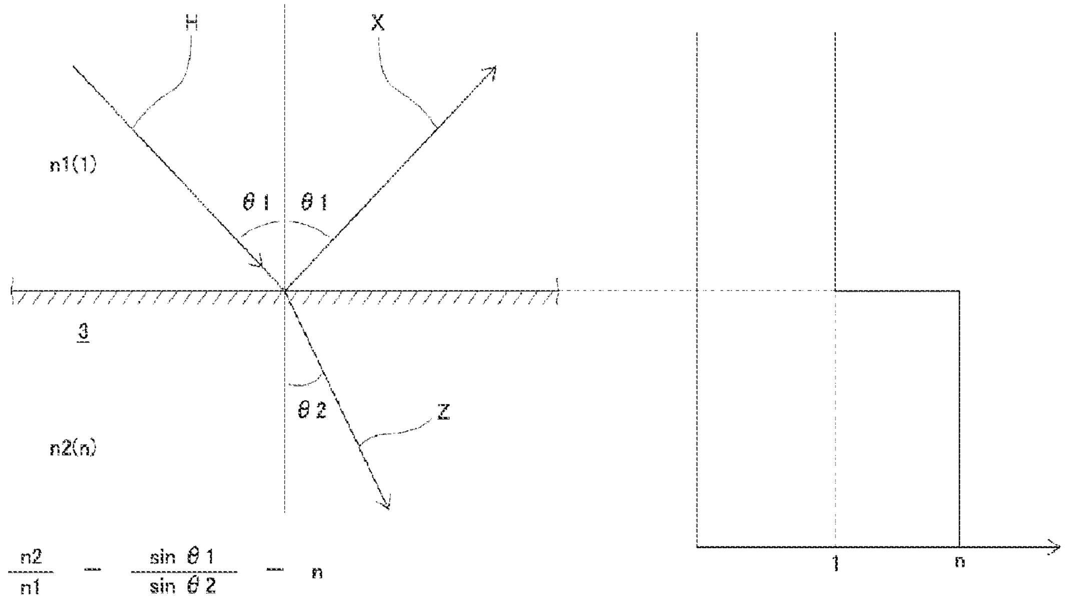
FIG. 10A
FIG. 10B
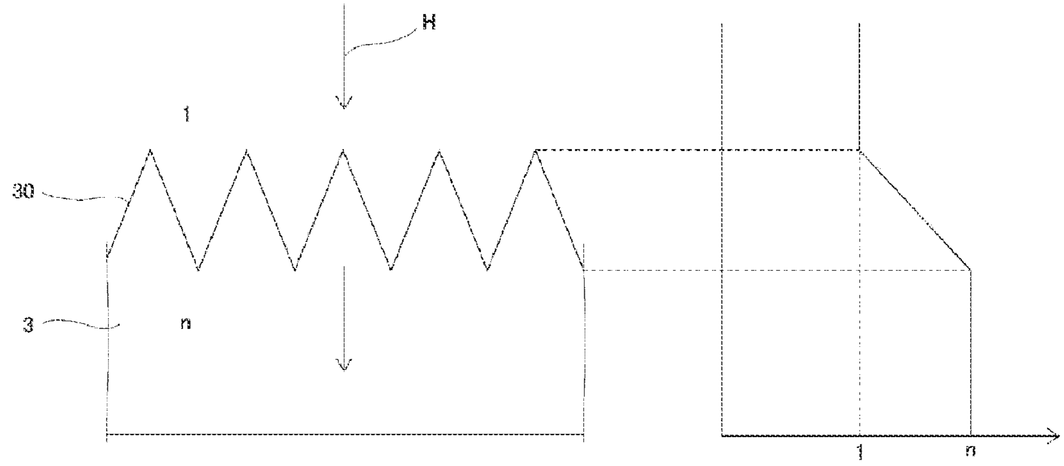

FIG. 15
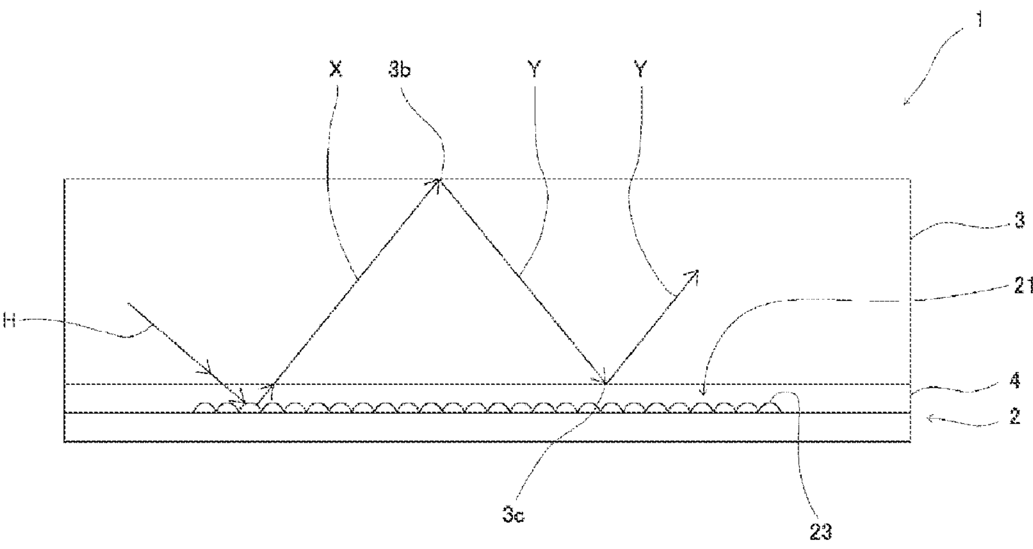
FIG. 16A
FIG. 16B
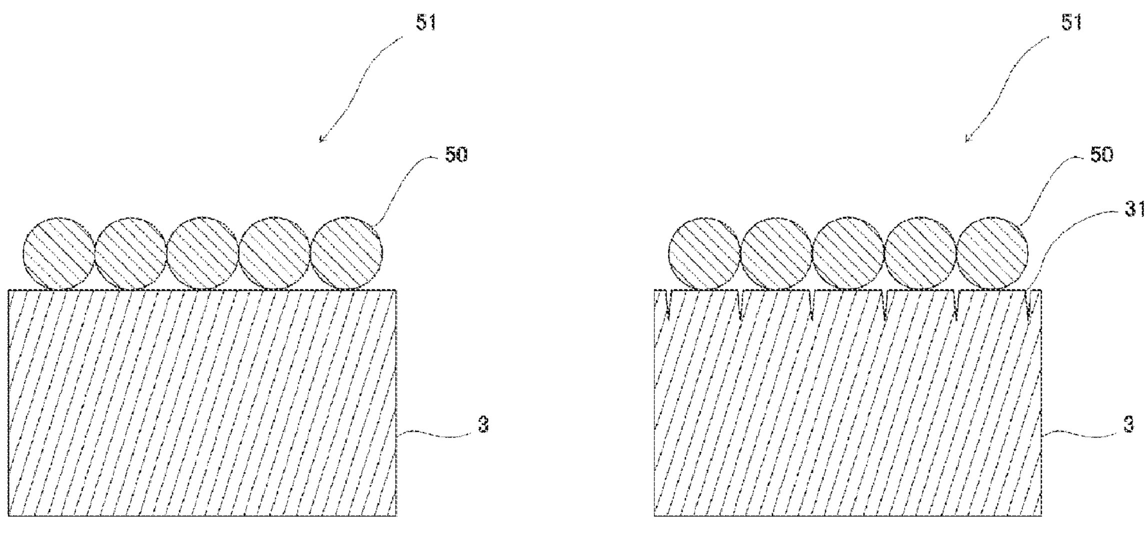

SOLID-STATE IMAGING DEVICE, METHOD FOR MANUFACTURING COVER GLASS, AND ELECTRONIC APPARATUS

CROSS REFERENCE TO RELATED APPLICATIONS

This application is a national stage application under 35 U.S.C. 371 and claims the benefit of PCT Application No. PCT/JP2022/007956, having an international filing date of 25 Feb. 2022, which designated the United States, which PCT application claimed the benefit of Japanese Patent Application No. 2021-035856, filed 5 Mar. 2021, the entire disclosures of each of which are incorporated herein by reference.

TECHNICAL FIELD

The present disclosure relates to a solid-state imaging device such as a CCD or a CMOS image sensor (CIS) having a cavity-less CSP structure, a method for manufacturing a cover glass used for the solid-state imaging device, and an electronic apparatus having the solid-state imaging device.

BACKGROUND ART

Conventionally, as a simple packaging method for an optical sensor, a chip scale package (hereinafter referred to as "CSP") structure has been proposed, and optical sensors having this CSP structure have been mass-produced. The CSP structure is different from a conventional structure formed by connecting a bare chip divided into individual pieces by bonding on a substrate and the like a cavity package including ceramics or a mold resin.

Specifically, a cover glass and a Si wafer of a sensor portion are bonded to each other in a state where a cavity structure is formed by providing a partition wall with a resin between adjacent chips in units of wafers. Then, rewiring is performed on a surface on a side opposite to a sensor surface and a through via (through silicon via: Thru Silicon Via, hereinafter referred to as "TSV") is formed, whereby the sensor portion is electrically connected to solder balls that are bumps or external connection terminals provided on the surface on the side opposite to the sensor portion, and the like. Then, the optical sensor is finally formed by dicing to be individual pieces.

Therefore, in the CSP structure, a void is formed between a light receiving portion of the optical sensor and the cover glass.

In this manner, the CSP structure can be configured such that the sensor chip and the bumps, the external connection terminals, and the like are connected through the TSV penetrating between a front surface and a back surface of the sensor chip to eliminate wiring using wire bonding, and that the cover glass is bonded in a wafer state in a clean room.

For this reason, the CSP structure can realize downsizing, cost reduction, and less dust as compared with a conventional chip on board (COB) type package.

However, in the CSP structure, it is necessary to reduce the thickness of the chip in order to form the TSV. However, since the void exists between the cover glass and the sensor chip (optical sensor) as described above, there is a possibility that the sensor chip is warped under the influence of thermal stress when a heating process such as solder reflow is performed.

Therefore, as a method for solving such a problem, a CSP structure (cavity-less CSP structure) in which a void between a cover glass and a sensor chip (optical sensor) is filled with a resin and there is no void has been proposed and put into practical use.

By adopting such a cavity-less CSP structure having no void, the thermal stress generated in the void of the CSP structure having the void can be significantly reduced, and the occurrence of warpage can be suppressed.

That is, as for warpage caused by weak mechanical rigidity of a silicon (Si) semiconductor substrate, since a thick cover glass of 300 to 800 μm and a Si semiconductor substrate are bonded and integrated in the cavity-less CSP structure, mechanical rigidity is increased with the addition of the rigidity of the cover glass. Therefore, the warpage can be prevented.

However, in the cavity-less CSP structure, the cover glass and the semiconductor substrate are bonded with a resin and integrated, and therefore, when light applied to the optical sensor formed on the semiconductor substrate is reflected, the light that has passed through the resin is incident on the cover glass as it is because the values of refractive indexes of the resin and the cover glass are close to each other. Then, when the incident light reaches a boundary of an upper surface of the cover glass with the air, the light is totally reflected into the cover glass by the upper surface of the cover glass due to the difference in refractive index between the air and the cover glass. As a result, the reflected light travels again in the direction of the optical sensor. Here, since the refractive index of the resin with which the cover glass and the semiconductor substrate are bonded, or of an infrared cut filter, is close to the refractive index of the cover glass, the light is incident on a microlens array as it is without being reflected at the resin or the infrared cut filter. A pixel of the sensor chip captures the incident light as an image signal and converts the image signal into an electric signal.

In this manner, there are problems that a flare phenomenon in which the pixel photoelectrically converts unnecessary incident light reflected inside the optical sensor so that the contrast is lowered and the image becomes whitish as a whole and a ghost (false image) phenomenon in which unnecessary incident light reflected inside the optical sensor is photoelectrically converted so that the light appears as a ring of light or in the form of a ball occur.

Patent Document 1 discloses a technology related to a solid-state imaging device and an electronic apparatus that adopt a structure in which grooves parallel to a left-right direction or a front-rear direction are periodically arranged on an upper surface of a cover glass and thus reflected light is diffracted to prevent reflected light to be incident on an optical sensor.

In the present technology, a diffraction grating diffracts reflected diffracted light generated such that incident light is incident on and diffracted in a pixel region in which a plurality of pixels is arranged on the upper surface of the semiconductor substrate. Therefore, the structure is formed such that a part of the reflected diffracted light is not reflected from the diffraction grating to a side on which the semiconductor substrate is provided, and that the part of the reflected diffracted light is transmitted to a side opposite to the side on which the semiconductor substrate is provided.

Patent Document 2 discloses a technology related to an imaging device and a camera module capable of suppressing warpage, suppressing the occurrence of flare, and obtaining a high-quality image in which flare is not conspicuous even in a case where a bright light source comes in a field of view.

The present technology includes an optical sensor including a light receiving portion, a sealing material for protecting a light receiving portion side of the optical sensor, an intermediate layer formed at least between the light receiving portion and a first surface of the sealing material, the first surface being a surface facing the light receiving portion, and a control film in which a cutoff wavelength is shifted to a short wavelength side according to an incident angle of light obliquely incident on the film. Then, the control film includes a first control film formed on the first surface of the sealing material, the first surface being the surface facing the light receiving portion, and a second control film formed on a second surface of the sealing material, the second surface being on a side opposite to the first surface.

CITATION LIST

Patent Document

Patent Document 1: Japanese Patent Application Laid-Open No. 2013-38164

Patent Document 2: Japanese Patent Application Laid-Open No. 2010-41941

SUMMARY OF THE INVENTION

Problems to be Solved by the Invention

However, in the technology related to the solid-state imaging device and the electronic apparatus disclosed in Patent Document 1, it is necessary for eliminating reflection to perform high-accuracy processing in order to periodically form the grooves in appropriate dimensions parallel to the left-right direction or the front-rear direction in the cover glass. Furthermore, since processing of bonding the cover glass subjected to such processing is also required, there is a problem in improving productivity. Furthermore, since the regular grooves are formed in this manner, there is a possibility that diffracted light reversely enters the optical sensor with respect to light at a specific wavelength or incident at a specific angle.

The technology related to the imaging device and the camera module disclosed in Patent Document 2 has a problem that the focal power of an on-chip microlens array becomes weak in the refractive index (around 1.5) of the control film filling a space between surfaces of the cover glass and the optical sensor, and the sensitivity of the optical sensor is lowered. For this reason, in the cavity-less CSP structure, it is conceivable to realize a structure in which OCL is including a material having a high refractive index of 1.7 to 2.1 such as $Si_3N_4$ so as not to reduce the focal power, but in the cavity-less CSP structure described above, there is a problem that flare (false image) light that has not occurred in a normal sensor package structure is generated.

Therefore, a measure is taken to adjust the refractive index by providing control films on both upper and lower surfaces of the cover glass. However, since the control films are laminated on both the upper and lower surfaces of the cover glass in this manner, there is a problem that the measure is not suitable for miniaturization. Furthermore, forming a film on one surface causes large warpage due to film formation stress, and there is a problem that a trouble in bonding to a semiconductor substrate or in a bonding apparatus easily occurs.

The present disclosure has been made in view of the problems described above, and it is an object of the present disclosure to provide a solid-state imaging device with high versatility capable of preventing the occurrence of flare and ghost and also being applied to chip size reduction, a method for manufacturing a cover glass, and an electronic apparatus including the solid-state imaging device.

Solutions to Problems

The present disclosure has been made to solve the problems described above, and a first aspect of the present disclosure is a solid-state imaging device including: a sensor substrate in which a plurality of pixels that receives incident light and converts the incident light into an electric signal is arranged; a semiconductor substrate having an upper surface on which the sensor substrate is mounted, the semiconductor substrate being configured to be able to connect the electric signal converted by the pixel to a bump or an external connection terminal disposed on a lower surface; a microlens array disposed on an upper surface of the sensor substrate so as to correspond to each of the pixels; a resin disposed on an upper surface of the microlens array; and a cover glass bonded to the microlens array via the resin and having a moth-eye structure formed on a surface of the cover glass.

Furthermore, in the first aspect, the resin may include a low refractive index material.

Furthermore, in the first aspect, a color filter and an absorption type infrared cut filter may be disposed between the semiconductor substrate and the microlens array.

Furthermore, in the first aspect, the moth-eye structure formed on the surface of the cover glass may have a plurality of minute protrusions formed on the surface of the cover glass and arranged on an upper surface of the cover glass.

Furthermore, in the first aspect, the minute protrusions may be irregular in size and irregularly arranged.

Furthermore, in the first aspect, the minute protrusions may be arranged in a size of $(1/1.6)\lambda(240\text{ nm})$ or less in a visible light wavelength region. Here, "$\lambda$" is a wavelength of light.

Furthermore, in the first aspect, upper surfaces of the plurality of minute protrusions formed on the surface of the cover glass may be covered with a thin film for preventing breakage.

Furthermore, a second aspect is a method for manufacturing a cover glass having a moth-eye structure, the method including: a step of substantially uniformly scattering single particles having a uniform particle size or irregular particle sizes on an upper surface of a cover glass to form a single-particle film; and a step of forming a large number of minute protrusions having a uniform size or irregular sizes on the upper surface of the cover glass by performing vapor phase etching on the cover glass using the single-particle film as an etching mask.

Furthermore, a third aspect is an electronic apparatus including a solid-state imaging device including: a sensor substrate in which a plurality of pixels that receives incident light and converts the incident light into an electric signal is arranged; a semiconductor substrate having an upper surface on which the sensor substrate is mounted, the semiconductor substrate being configured to be able to connect the electric signal converted by the pixel to a bump or an external connection terminal disposed on a lower surface; a microlens array disposed on an upper surface of the sensor substrate so as to correspond to each of the pixels; a resin disposed on an upper surface of the microlens array; and a cover glass bonded to the microlens array via the resin and having a moth-eye structure formed on a surface of the cover glass.

By adopting the aspect described above, it is possible to reduce the occurrence of flare and ghost of the solid-state imaging device.

According to the present disclosure, it is possible to provide a solid-state imaging device with high versatility having a flare prevention structure with a cavity-less CSP structure capable of also being applied to chip size reduction, a method for manufacturing a cover glass having a moth-eye structure, and an electronic apparatus including the solid-state imaging device.

BRIEF DESCRIPTION OF DRAWINGS

FIGS. 9A and 9B are diagrams for explaining refraction, reflection, and a change in the refractive index of light incident on a cover glass.

FIGS. 10A and 10B are diagrams illustrating a change in the refractive index of light incident on a cover glass having a moth-eye structure.

FIG. 15 is a schematic outline cross-sectional view for explaining reflection of light incident on a solid-state imaging device according to a second embodiment of the solid-state imaging device in which a moth-eye structure is formed on an upper surface of a cover glass.

FIGS. 16A and 16B are cross-sectional views for explaining steps of a first embodiment of a method for manufacturing a cover glass having a moth-eye structure (part 1).

MODE FOR CARRYING OUT THE INVENTION

Figure 1:
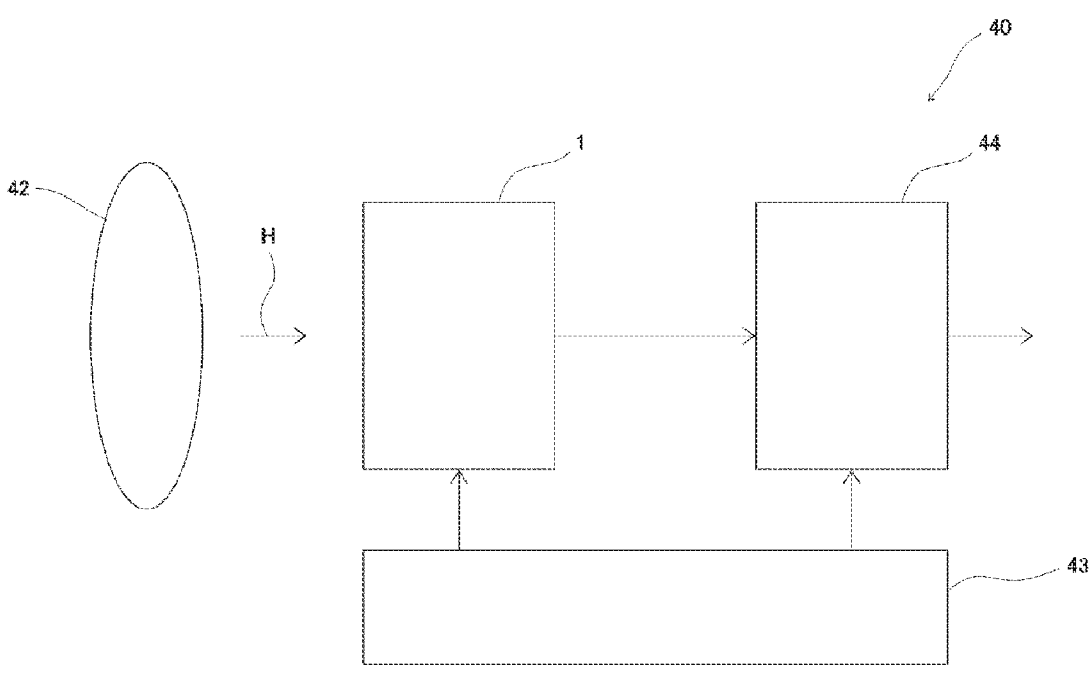
FIG. 1 is a configuration diagram illustrating a configuration of a camera using a solid-state imaging device.

Next, modes for carrying out the present disclosure (hereinafter, referred to as "embodiments") will be described in the following order with reference to the drawings. In the following drawings, the same or similar parts are denoted by the same or similar reference numerals. However, the drawings are schematic, and dimensional ratios and the like of the respective parts do not necessarily match actual ones. Furthermore, it is needless to say that dimensional relationships and ratios are partly different between the drawings.

1. Configuration Example of Main Part of Camera using Solid-State Imaging Device
2. Configuration of Main Part of Solid-State Imaging Device
3. First Embodiment of Solid-State Imaging Device having Flare Prevention Structure
4. Second Embodiment of Solid-State Imaging Device having Flare Prevention Structure
5. First Embodiment of Method for Manufacturing Cover Glass having Moth-Eye Structure
6. Second Embodiment of Method for Manufacturing Cover Glass having Moth-Eye Structure
7. Configuration Example of Electronic Apparatus having Solid-State Imaging Device

1. Configuration Example of Main Part of Camera Using Solid-State Imaging Device FIG. 1 is a configuration diagram illustrating a configuration of a camera 40 using a solid-state imaging device 1. As illustrated in FIG. 1, the camera 40 includes the solid-state imaging device 1, an optical system 42, a control unit 43, and a signal processing unit 44. The optical system 42 includes an optical member such as an image forming lens, and is disposed so as to condense and form incident light H as an image on a pixel region PA (refer to the schematic cross-sectional views illustrating a structure of the solid-state imaging device 1 in FIGS. 2, 4, and 12.) of the solid-state imaging device 1.

Figure 2:
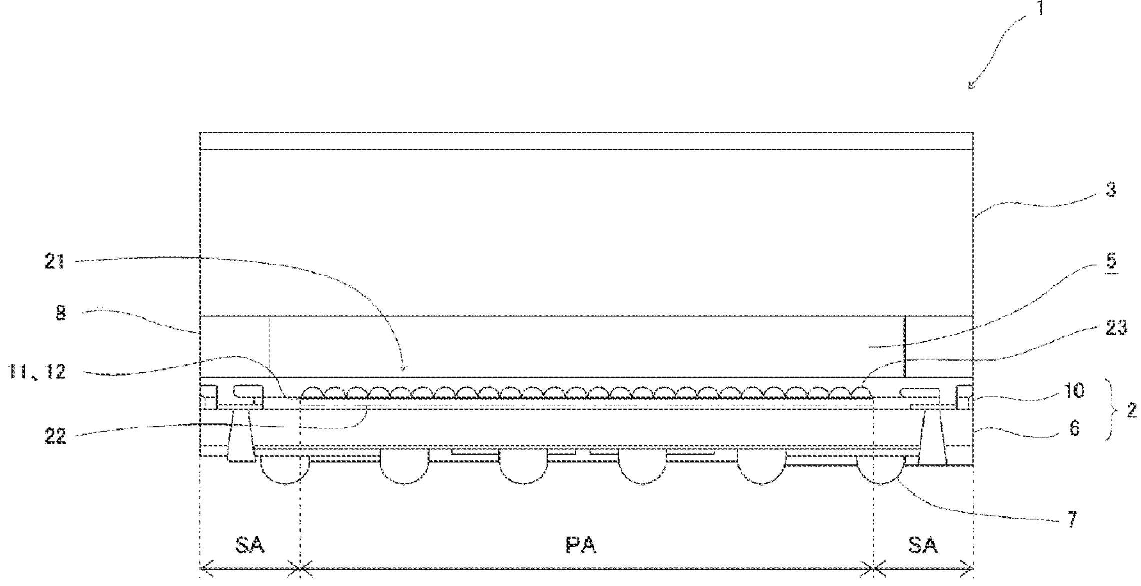
FIG. 2 is a schematic cross-sectional view illustrating a configuration of a solid-state imaging device having a cavity CSP structure.

As illustrated in FIG. 2, the solid-state imaging device 1 is a device that converts an optical signal corresponding to a subject image from the optical system 42 and formed as the image on the pixel region PA into an electric signal. That is, the incident light H from the subject image is received in the pixel region PA of the solid-state imaging device 1 via the optical system 42 and photoelectrically converted, and thus, signal charges corresponding to pixels 22 of the subject image are generated. The solid-state imaging device 1 includes a complementary metal oxide semiconductor (CMOS) type image sensor chip and a charge coupled device (CCD) type image sensor chip.

The control unit 43 is a control device that outputs various control signals to the solid-state imaging device 1 and the signal processing unit 44, and controls the solid-state imaging device 1 and the signal processing unit 44 to drive the camera 40. The solid-state imaging device 1 is driven on the basis of the control signal output from the control unit 43. That is, the signal charges accumulated in the solid-state imaging device 1 are sequentially read on the basis of the control signal and output as an electric signal. The signal processing unit 44 generates, for example, a color digital image by performing signal processing on the electric signal output from the solid-state imaging device 1.

2. Configuration of Main Part of Solid-State Imaging Device

FIG. 2 is a schematic cross-sectional view illustrating a basic configuration of a cavity CSP structure. As illustrated in FIG. 2, the solid-state imaging device 1 having the cavity CSP structure includes a light receiving portion 21 and a cover glass 3, and the light receiving portion 21 and the cover glass 3 are arranged to face each other. Furthermore, the light receiving portion 21 and the cover glass 3 are bonded via a sealing resin 8 at a peripheral edge portion of an optical sensor 2 except for the light receiving portion 21. Therefore, the solid-state imaging device 1 illustrated in the drawing is provided with a void 5 between the cover glass 3 and the light receiving portion 21. Since such a void 5 is included, it is called a "cavity structure".

Figure 3:
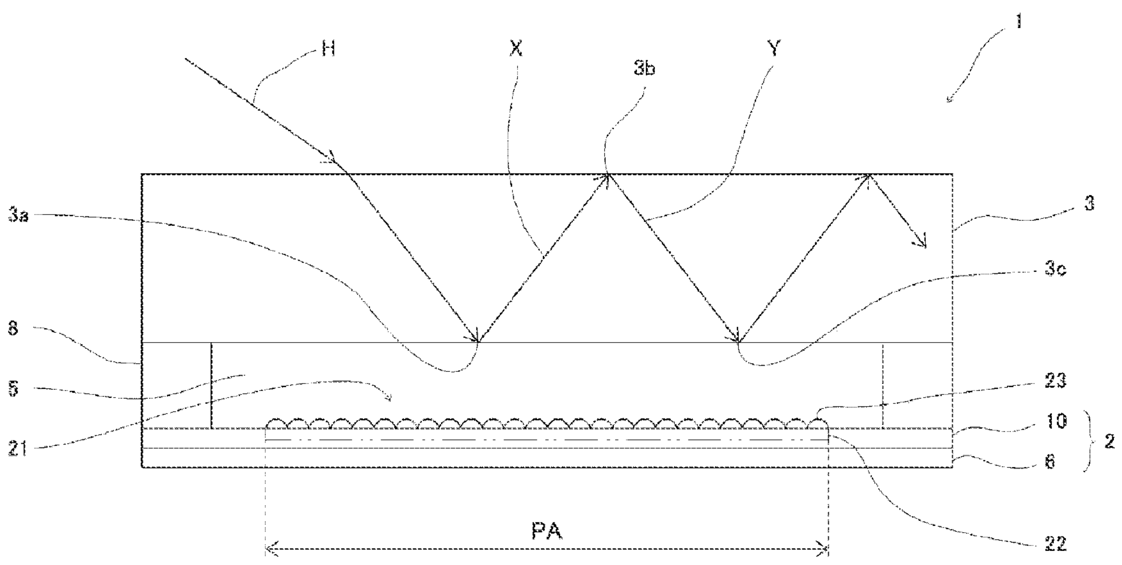
FIG. 3 is a diagram for explaining reflection at an upper surface of a cover glass in the cavity CSP structure.

FIG. 3 is a diagram for explaining reflection at an upper surface of the cover glass 3 in the cavity CSP structure. Capturing of a color image is performed such that each of the pixels 22 in the pixel region PA of the optical sensor 2 receives the incident light H in a visible light region incident as a subject image from above through the cover glass 3.

In the cavity CSP structure having the void 5 between the optical sensor 2 and the cover glass 3, the refractive index of the cover glass 3 is larger than the refractive index of the air. For this reason, as illustrated in FIG. 3, when the incident light H incident at an angle larger than a critical angle θc strikes a lower surface 3*a* of the cover glass 3, the incident light H is totally reflected toward the cover glass 3 side at a boundary surface 3*a* between the cover glass 3 and the air, and becomes reflected light X. The reflected light X travels toward an upper surface 3*b* of the cover glass 3, is re-reflected by the upper surface 3*b*, and becomes re-reflected light Y. The re-reflected light Y travels toward a lower surface 3*c* of the cover glass 3 and is re-reflected by the lower surface 3*c*. In this manner, the reflected light X that is not transmitted through the upper surface 3*b* of the cover glass 3 is also totally reflected by the lower surface 3*c* of the cover glass 3. For this reason, the reflected light X does not return to the light receiving portion 21 of the optical sensor 2. Note that the critical angle θc will be described later.

Therefore, in the cavity CSP structure, flare and ghost do not cause a large problem as compared with a cavity-less CSP structure.

Figure 4:
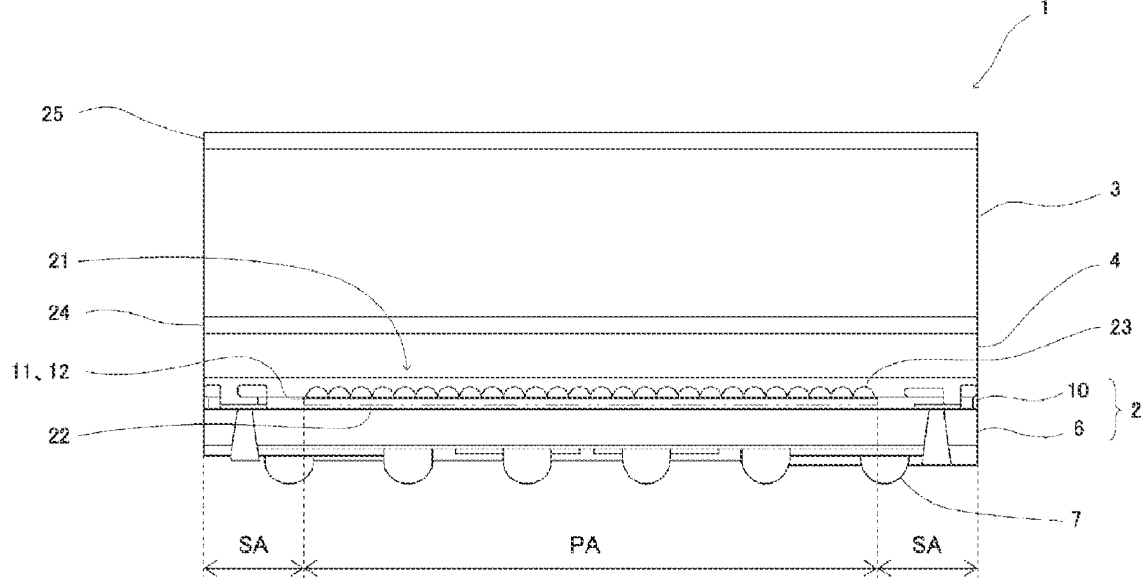
FIG. 4 is a schematic cross-sectional view illustrating a configuration of a solid-state imaging device having a cavity-less CSP structure.

FIG. 4 is a schematic cross-sectional view illustrating a configuration of the solid-state imaging device 1 having the cavity-less CSP structure. As illustrated in the drawing, the solid-state imaging device 1 includes the light receiving portion 21 and the cover glass 3, and the light receiving portion 21 and the cover glass 3 are arranged to face each other. Furthermore, as illustrated in the drawing, a resin 4 is interposed between the light receiving portion 21 and the cover glass 3, and the light receiving portion 21 and the cover glass 3 are bonded via the resin 4. In this manner, the solid-state imaging device 1 illustrated in FIG. 4 is not provided with the void 5 between the cover glass 3 and the light receiving portion 21. In this manner, since the void 5 is not included, it is called a "cavity-less structure".

In the solid-state imaging device 1 illustrated in FIG. 4, the light receiving portion 21 is, for example, a CMOS image sensor chip and includes a semiconductor substrate 6. The semiconductor substrate 6 includes, for example, single crystal silicon. A sensor substrate 10 is disposed on an upper surface of the semiconductor substrate 6, and the pixel region PA and a peripheral region SA are provided on an upper surface (front surface), which is a surface of the sensor substrate 10 on a side facing the cover glass 3, as illustrated in the drawing.

In the pixel region PA, a plurality of the pixels 22 is arranged in a matrix, and an aggregate of these pixels 22 forms a subject image as a whole. Therefore, the resolution of an image of a subject is determined by the number of the pixels 22, and the larger the number of the pixels 22, the higher the resolution of the image. The pixel 22 is a photoelectric conversion element that converts each optical signal constituting a part of the subject image formed as the image by the optical system 42 into an electric signal. The photoelectric conversion element is, for example, a photodiode, and receives light incident as a subject image via the optical system 42 including an external imaging lens on a light receiving surface and photoelectrically converts the light to generate signal charges.

Figure 5:
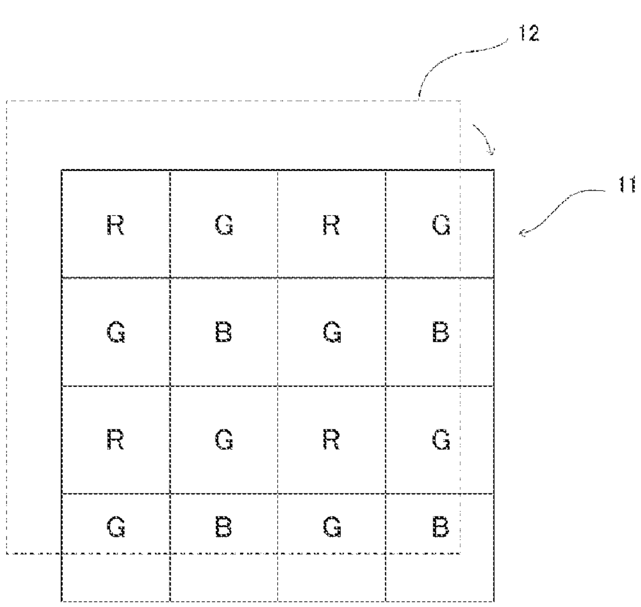
FIG. 5 is a plan view illustrating a layout of a color filter of the cavity-less CSP structure.

A color filter 11 is formed on an upper surface of each of the plurality of pixels 22 so as to cover the plurality of pixels 22. As for the color filter 11, the color filters 11 of red (R), green (G), and blue (B), which are three primary colors of colors, are formed in an array as an on-chip color filter (OCCF) with a Bayer (Bayaer) array, for example, as illustrated in the plan view of FIG. 5. Note that the array pattern of the color filters 11 is not limited to the Bayer pattern.

Furthermore, an absorption type infrared cut filter (IR cut filter) 12 may be provided so as to overlap the color filter 11. The absorption type infrared cut filter 12 absorbs infrared rays having a predetermined wavelength or more, and thus does not reflect infrared light. Therefore, it is possible to suppress, for example, the remarkable occurrence of red ghost called "red ball ghost" in a captured image caused by re-reflection of reflected infrared rays.

On the upper surface of the color filter 11, a microlens array 23 for each of the pixels 22 to condense light is provided directly or via the infrared cut filter 12. Moreover, the resin 4 is provided on the upper surface of the microlens array 23 so as to cover the microlens array 23.

The resin 4 is interposed between the light receiving portion 21 and the cover glass 3. That is, they are bonded with the resin 4 interposed therebetween.

The peripheral region SA is a region surrounding the periphery so as to enclose the pixel region PA. In the peripheral region SA, a wiring layer and the like for extracting an image signal from the pixel 22 to the outside and connecting the image signal to bumps 7 are formed. Then, as illustrated in FIG. 4, the bumps 7 are provided on the lower surface (back surface) of the semiconductor substrate 6, and are connected to the wiring layer formed inside the semiconductor substrate 6 via TSV As illustrated in FIG. 4, each of the pixels 22 in the pixel region PA receives the incident light H in the visible light region incident as a subject image from above through the cover glass 3 and the resin 4, whereby the sensor substrate 10 captures a color image.

The solid-state imaging device 1 having the cavity-less CSP structure does not have the void (cavity) 5 as described above, and the semiconductor substrate 6 and the sensor substrate 10, and the cover glass 3 are bonded at their surfaces via the resin 4 and integrated. With this arrangement, strength against warpage can be maintained, and wafers of the semiconductor substrate 6 and the sensor substrate 10 can be thinned. Furthermore, since wire bonding between the sensor substrate 10 and the semiconductor substrate 6 is also unnecessary, a cavity that is the void 5 is also unnecessary, and the package itself can be thinned. Further, since it is only required to perform singulation after assembly, cost reduction can be realized.

3. First Embodiment of Solid-State Imaging Device Having Flare Prevention Structure

[Cause of Occurrence of Flare and Ghost Phenomena]

Figure 6:
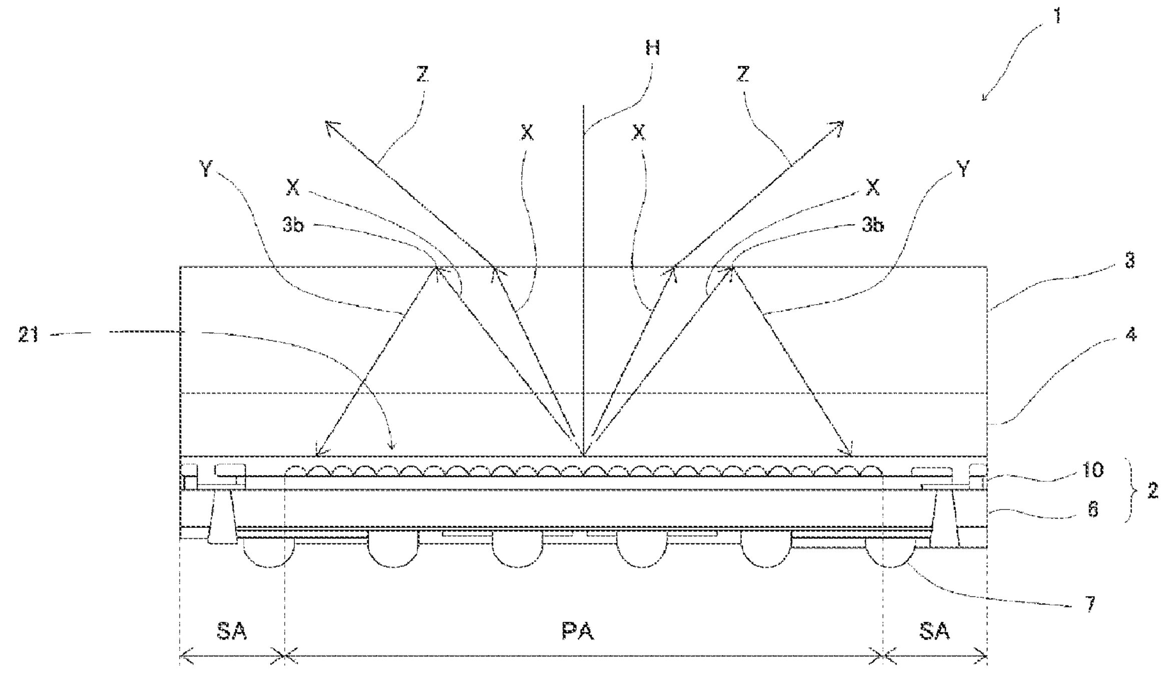
FIG. 6 is a diagram explaining the occurrence of flare in the cavity-less CSP structure.

However, as described above, in the solid-state imaging device 1 having the cavity-less CSP structure, there is a problem that flare and ghost occur in a captured image due to the reflected light X generated by the pixels 22 or the microlenses 23 arranged with periodicity in a matrix in the pixel region PA of the light receiving portion 21, and image quality is deteriorated. Specifically, as illustrated in FIG. 6, in a case where the incident light H is incident as a subject image from above on the microlens array 23 periodically arranged corresponding to each of the plurality of pixels 22, the light is reflected. Then, when the reflected light X passes through a member such as the infrared cut filter 12 disposed above the semiconductor substrate 6 and reaches a boundary 3*b* of the upper surface of the cover glass 3 with the air, the reflected light X is re-reflected there. The re-reflected light Y passes again through the cover glass 3 and is incident on the microlens array 23. The pixel 22 performs conversion into an electric signal in response to the re-reflected light Y, whereby flare and ghost occur in a captured image.

A cause of the occurrence of flare and ghost in the cavity-less CSP structure will be described in more detail. As illustrated in FIG. 6, when the incident light H is perpendicularly applied to the cover glass 3, the incident light H passes through the cover glass 3 and is applied to the light receiving portion 21. When the light applied to the light receiving portion 21 is incident on the microlens arrays 23 or the pixels 22 arranged with periodicity in the light receiving portion 21, the light is reflected at the microlens arrays 23 or the pixels 22 to become the reflected light X. The reflected light X passes through the resin 4 and the cover glass 3 and reaches the upper surface 3*b* of the cover glass 3. Here, when the reflected light X is incident on the cover glass 3 at an incident angle smaller than the critical angle θc, the reflected light X becomes transmitted light Z at the upper surface 3*b* of the cover glass 3 and escapes into the air.

Furthermore, when the reflected light X is incident on the cover glass 3 at an incident angle larger than the critical angle θc, the reflected light X is re-reflected at the upper surface 3*b* of the cover glass 3, becomes the re-reflected light Y, and travels again in the direction of the light receiving portion 21.

The re-reflected light Y is light that is incident on the cover glass 3 and the resin 4 at an incident angle larger than the critical angle θc. The re-reflected light Y passes again through the cover glass 3 and the resin 4 and is incident on the light receiving portion 21. The pixel 22 of the light receiving portion 21 captures the re-reflected light Y as an image signal and converts the image signal into an electric signal. As a result, flare and ghost are generated.

Note that the critical angle θc is an incident angle at which total reflection starts. That is, when incident light is incident at an angle smaller than the critical angle θc, the incident light is transmitted, and when incident light is incident at an angle larger than the critical angle θc, the incident light is reflected. The critical angle θc is obtained by $$\theta c = \arcsin(n2/n1).$$

Here, n1 is the refractive index of a substance of an incident source, and n2 is the refractive index of a substance of a traveling destination.

In the example of FIG. 6, since the refractive index of the air is "1", θc=arcsin (n2) is obtained when n1=1. That is, n2=sin θc, and if n2=n, n=sin θc, and the refractive index n of the cover glass 3 is obtained. In the following description, the refractive index of the air is 1, and the refractive index of the cover glass 3 is n.

Furthermore, strictly speaking, not all the light is reflected at the boundary between the upper surface 3*b* of the cover glass 3 and the air, but a part of the light is transmitted through the cover glass 3. This is because the value of the critical angle θc varies depending on the wavelength of light. However, in the present specification, such a difference in wavelength will be omitted.

Figure 7:
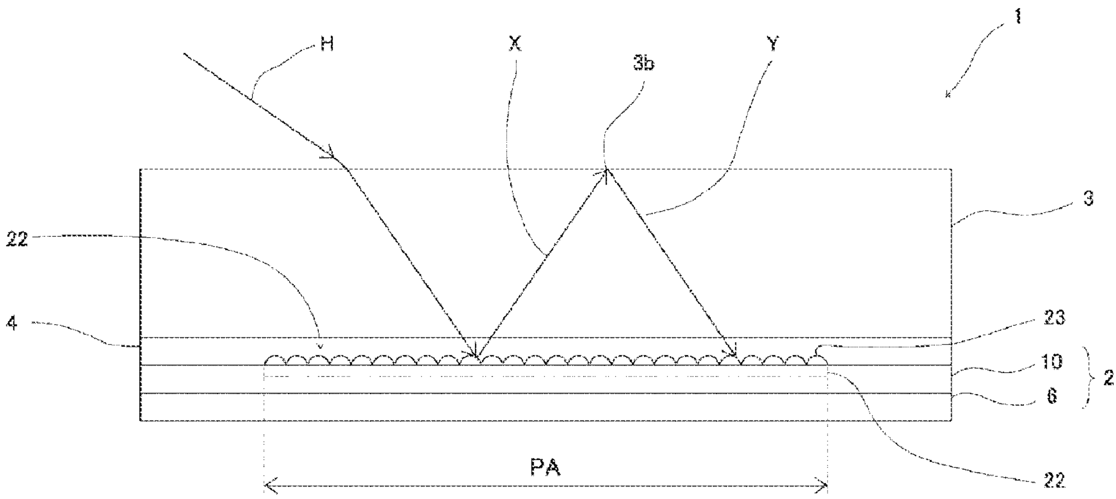
FIG. 7 is a diagram for explaining reflection at an upper surface of a cover glass in the cavity-less CSP structure.

FIG. 7 is a diagram for explaining reflection at the upper surface of the cover glass 3 in the cavity-less CSP structure. In the cavity-less CSP structure, the cover glass 3, and the sensor substrate 10 and the semiconductor substrate 6 are bonded via the resin 4 and integrated. Therefore, when the incident light H on the light receiving portion 21 formed on the sensor substrate 10 is reflected, the reflected light X that has passed through the resin 4 is incident on the cover glass 3 as it is since the values of refractive indexes of the resin 4 and the cover glass 3 are close to each other. Then, when the reflected light X reaches the upper surface 3*b* that is the boundary of the cover glass 3 with the air, the reflected light X is re-reflected into the cover glass 3 due to the difference in refractive index between the air and the cover glass 3. As a result, the re-reflected light Y travels again in the direction of the light receiving portion 21.

Here, since the refractive index of the resin 4 or the infrared cut filter 12 is close to the refractive index of the cover glass 3, the re-reflected light Y is not reflected at the resin 4 or the infrared cut filter 12 and is incident on the microlens array 23 as it is. The pixel 22 captures the re-reflected light Y as an image signal and converts the image signal into an electric signal. As a result, flare and ghost are generated.

First Embodiment

Therefore, a first embodiment of a solid-state imaging device 1 having a structure for preventing the occurrence of flare and ghost will be described below.

Figure 8:
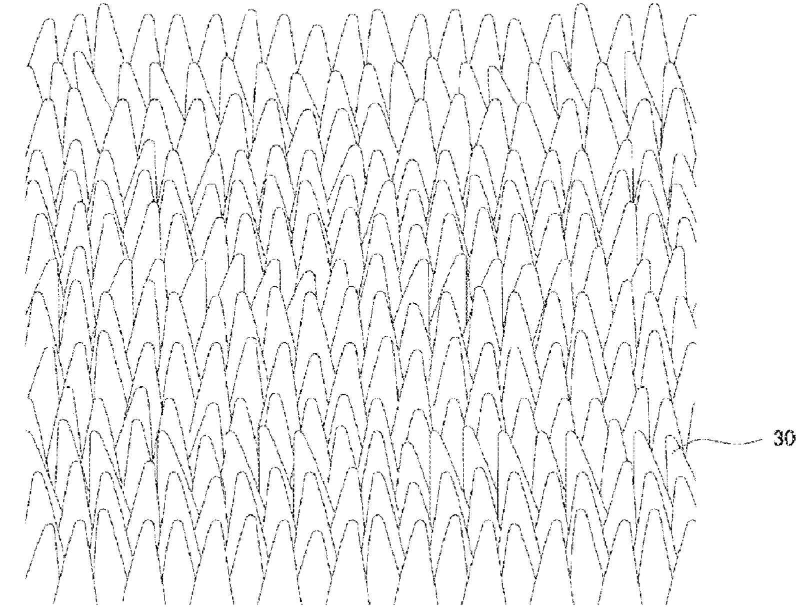
FIG. 8 is an enlarged external perspective view of a moth-eye structure.

As illustrated in FIG. 8, one aspect of a technology for preventing the occurrence of flare and ghost in a captured image is configured such that a minute protrusion 30 (moth-eye structure) having a substantially triangular pyramid shape or a substantially hanging bell shape formed so as to be tapered upward with respect to a bottom surface is formed on a surface portion of the upper surface of the cover glass 3 so that re-reflection of the reflected light X in the optical sensor 2 is suppressed at the upper surface 3*b* of the cover glass 3.

It is generally known that the eyes of a moth have a compound eye structure. That is, the compound eye of a moth is an aggregate of a large number of groups of facets forming a substantially hexagonal shape, and each substantially hexagonal shape further includes a large number of facets arranged. Then, the surface of the facet is including an aggregate in which minute protrusions are further arranged. The minute protrusion generally has a substantially hanging bell shape, and has a height of 200 to 250 nm and an interval of about 200 nm. Therefore, such a structure is called a "moth-eye structure" following the structure of the compound eye of a moth. Since the moth-eye structure has such a structure, the moth-eye structure has an effect of preventing reflection of light. That is, such a structure is considered to be convenient for avoiding predation because the eyes do not reflect and emit light even when the moth receives light in a dark place.

The present disclosure applies such a moth-eye structure to flare prevention. The size of the minute protrusion in this case is as follows according to the concept in optical design. That is, in a case where a large number of the minute protrusions 30 having an inclined structure in cross section are formed on the surface of the cover glass 3, it is preferable that the pitch of the minute protrusions 30 is (1/1.6)λ(240 nm) or less in a visible light wavelength region, and the depth thereof is at least 50 nm or more, preferably 152 nm or more, more preferably 380 nm or more, and still more preferably 760 nm or more. This formation is equivalent to the presence of an infinite number of layers whose refractive indexes continuously change in the depth direction, and Fresnel reflection does not occur.

The reflection of light is mainly caused by an abrupt change in the refractive index of the incident surface. That is, as illustrated in FIG. 9A, when the incident light H is incident on the cover glass 3 at the incident angle θ1, the incident light H becomes the reflected light X at the upper surface of the cover glass 3 in a case where the incident angle θ1 is larger than the critical angle θc. Furthermore, in a case where the incident angle θ1 is smaller than the critical angle θc, the incident light H becomes the transmitted light Z at the refraction angle θ2 and is transmitted through the cover glass 3. The reflected light X is generated because the refractive index suddenly changes from 1 to n at the boundary between the air and the cover glass 3 as illustrated in FIG. 9B. That is, the refractive index is discontinuous when viewed from the incident light H. Light is reflected at a boundary surface where the refractive index is discontinuous. Here, the refractive index n of the cover glass 3 is obtained by Snell's law as follows:

$$n=\sin\theta 1/\sin\theta 2.$$

Therefore, if a structure is configured such that the refractive index changes continuously and smoothly at the boundary where the incident light H is incident on the cover glass 3, the incident light H is not reflected. That is, by forming the minute protrusions 30 to have a size equal to or smaller than the wavelength of visible light, the reflection of the incident light H can be reduced to almost 0. Therefore, it is conceivable to apply the moth-eye structure having an effect of preventing reflection of light for suppressing flare.

Next, a principle that reflection of light can be prevented by the moth-eye structure will be described below.

Figure 11:
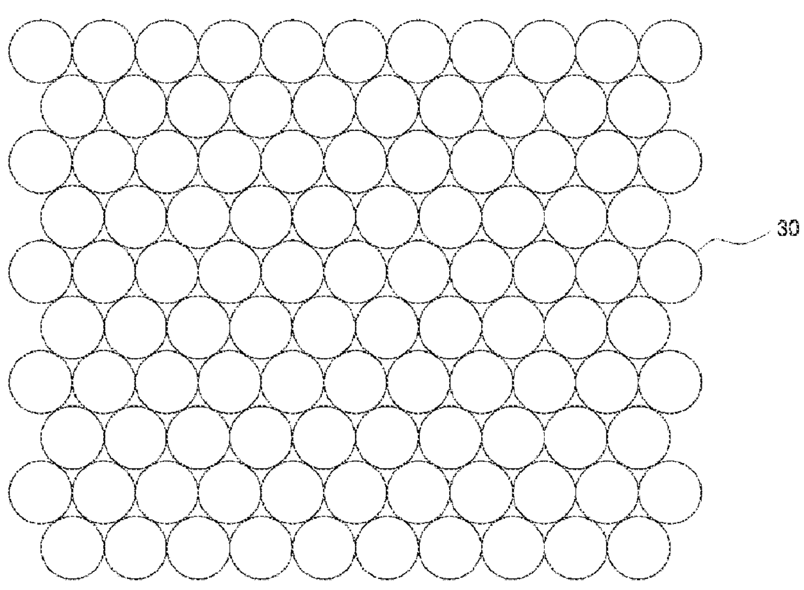
FIG. 11 is a plan view illustrating a surface structure of a first embodiment of a cover glass having the moth-eye structure.

FIG. 10A is a schematic cross-sectional view of a moth-eye structure. Furthermore, FIG. 11 is a plan view of the moth-eye structure according to FIG. 10A. Here, for convenience of description, an example of the minute protrusions 30 of the moth-eye structure in which a plurality of isosceles triangles having acute angles at their apexes are arranged in the lateral direction will be described.

In FIG. 10A, when the incident light H is applied to the moth-eye structure from above, the incident light H passes through the inside of the cover glass 3 via a valley between the isosceles triangles of the minute protrusions 30. The refractive index of the cover glass 3 configured as described above is n, and the refractive index of the air is 1. Here, when the incident light H that has passed through the air having a refractive index of 1 reaches the minute protrusions 30 of the moth-eye structure of the cover glass 3, the refractive index of the moth-eye structure is 1 at the apex of the minute protrusion 30 similarly to that of the air as illustrated in FIG. 10B.

However, the refractive index approaches the refractive index n of the cover glass 3 as the incident light H reaches deep portions of the minute protrusions 30 standing close together. Then, when the incident light H passes through the valley between the minute protrusions 30 standing close together, the refractive index at the passing point becomes n, which is the refractive index of the cover glass 3. That is, in a case where the incident light H escapes from the air to the cover glass 3, the refractive index continuously changes from 1 to n as illustrated in FIG. 10B. Conversely, also in a case where the incident light H escapes from the cover glass 3 to the air, the refractive index continuously changes from n to 1 in a similar manner.

As described above, it is understood that the refractive index of the cover glass 3 having the surface formed with the moth-eye structure continuously changes from the refractive index 1 to n without discontinuity between the refractive indexes 1 to n as illustrated in FIG. 10B. The moth-eye structure is formed such that the refractive indexes of the air and the cover glass 3 continuously change from 1 to n in this manner. Therefore, since there is no discontinuous portion of the refractive index, the light passing through the moth-eye structure passes as it is without being reflected. This is the principle of the solid-state imaging device 1 having the cavity-less CSP structure, which is the technology according to the present disclosure. Furthermore, an upper surface of the moth-eye structure formed on the surface of the cover glass 3 may be covered with a thin film 9 for preventing the breakage of the minute protrusions 30. For the thin film 9 for covering, for example, silicon dioxide ($SiO_2$) is desirably formed to a film thickness of 125 nm or more.

Figure 12:
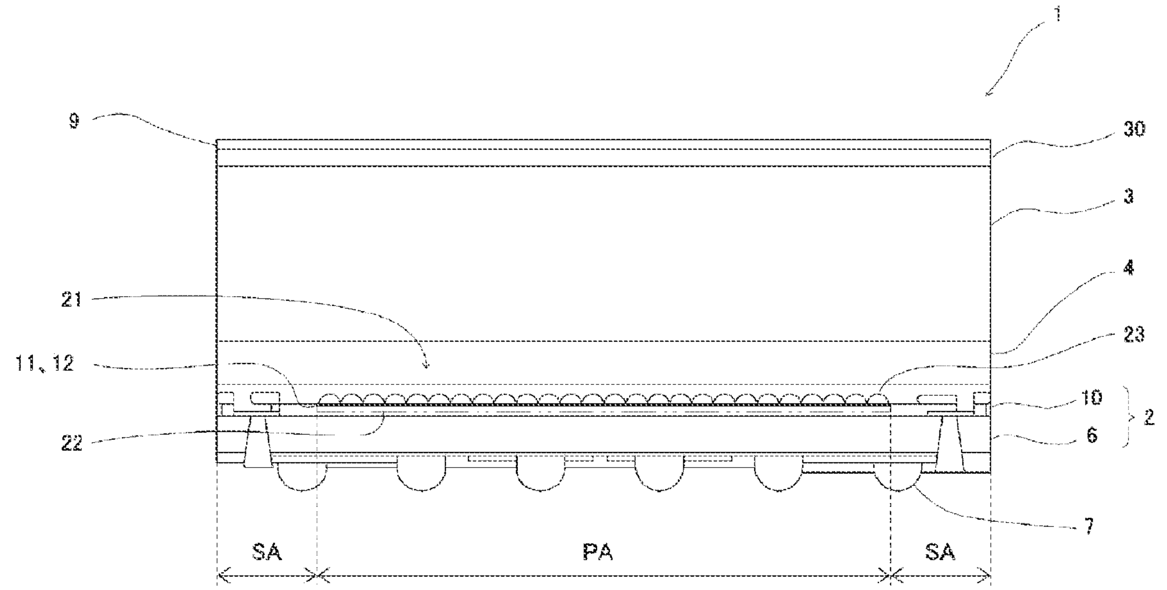
FIG. 12 is a schematic cross-sectional view illustrating a structure of a first embodiment of a solid-state imaging device in which a moth-eye structure is formed on an upper surface of a cover glass.

Next, the solid-state imaging device 1 having the cavity-less CSP structure and adopting the moth-eye structure will be described. FIG. 12 is a cross-sectional view illustrating a structure of the solid-state imaging device 1 in which the moth-eye structure is formed on the upper surface of the cover glass 3. In the drawing, the light receiving portion 21 and the cover glass 3 are included, and the light receiving portion 21 and the cover glass 3 are arranged to face each other. Furthermore, as illustrated in the drawing, the resin 4 is interposed between the light receiving portion 21 and the cover glass 3. Then, the entire surfaces of the light receiving portion 21 and the cover glass 3 are bonded via the resin 4. The solid-state imaging device 1 illustrated in the drawing has the "cavity-less structure". That is, since the resin 4 is interposed on the entire surfaces between the light receiving portion 21 and the cover glass 3, a cavity that is the void 5 is not provided.

In the solid-state imaging device 1, the light receiving portion 21 is, for example, a CMOS image sensor chip, and includes the semiconductor substrate 6 as illustrated in FIG. 4. The semiconductor substrate 6 includes, for example, single crystal silicon. As illustrated in FIG. 12, the pixel region PA and the peripheral region SA are provided on the upper surface (front surface) of the semiconductor substrate 6 facing the cover glass 3.

In the pixel region PA, the plurality of pixels 22 are arranged in a matrix, and an aggregate of these pixels 22 forms a subject image as a whole. Furthermore, the color filter 11 is formed on the upper surface of each of the plurality of pixels 22 so as to cover the plurality of pixels 22.

Note that this cavity-less structure is similar to the general "cavity-less structure" described above with reference to FIG. 4, in which the color filter 11 and the microlens array 23 for each of the pixels 22 to condense light are provided, the peripheral region SA and the pixel region PA are provided, and the bumps 7 are provided on the lower surface (back surface) of the semiconductor substrate 6 for extracting an image signal to the outside and connected to the wiring layer by the TSV, and therefore, the description thereof is omitted.

Here, in a case where no measures are taken, the refractive index of the resin 4 or the infrared cut filter 12 is close to the refractive index of the cover glass 3 as described above. Therefore, the re-reflected light Y reflected by the upper surface 3*b* of the cover glass 3 enters the microlens array 23 as it is without being reflected by the lower surface 3*c* of the cover glass 3. The pixel 22 performs conversion into an electric signal in response to the re-reflected light Y. Therefore, the re-reflected light Y is captured as an image signal. As a result, flare and ghost are generated.

Figure 13:
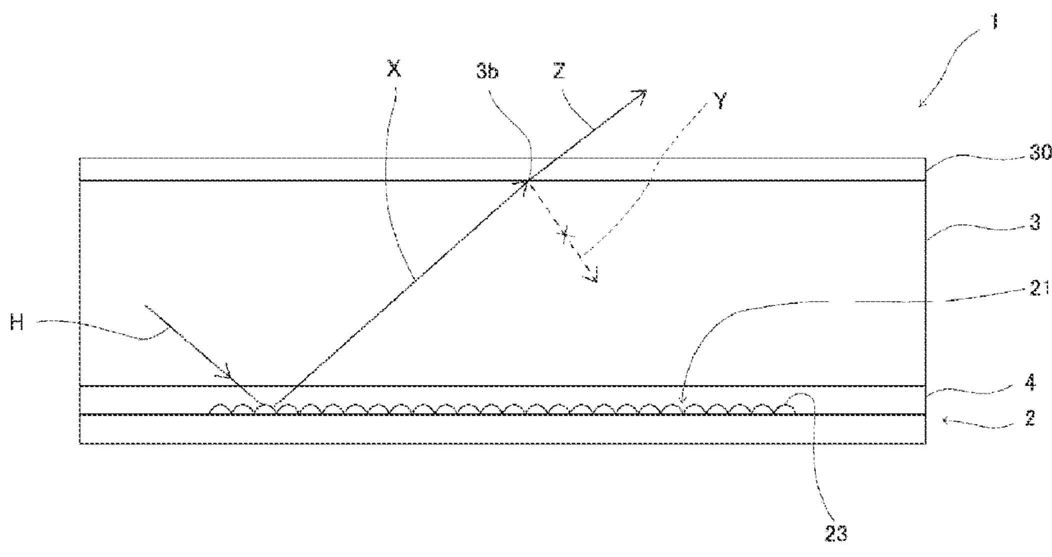
FIG. 13 is a schematic outline cross-sectional view for explaining refraction and reflection of light incident on a cover glass having a moth-eye structure.

However, by adopting the moth-eye structure on the upper surface of the cover glass 3, the incident light H is reflected as follows. That is, as illustrated in FIG. 13, the incident light H applied to the light receiving portion 21 formed on the sensor substrate 10 is reflected by the surface of the microlens array 23 of the light receiving portion 21, and enters the cover glass 3 as the reflected light X. Then, the reflected light X that has passed through the cover glass 3 and reached the upper surface 3*b* of the cover glass 3 passes through the minute protrusions 30 of the moth-eye structure. Since the refractive indexes of the air and the cover glass 3 in the moth-eye structure are continuous, the reflected light X is not reflected by the upper surface 3*b* of the cover glass 3 into the cover glass 3 and escapes as it is into the air as the transmitted light Z.

For this reason, a phenomenon in which the reflected light X that has reached the upper surface 3*b* of the cover glass 3 becomes the re-reflected light Y at the upper surface 3*b* of the cover glass 3 and travels in the direction of the optical sensor 2 does not occur. Therefore, the re-reflected light Y is not incident as it is on the microlens array 23, and the pixel 22 does not capture the re-reflected light Y as an image signal. Therefore, the occurrence of flare and ghost can be suppressed.

As described above, by adopting the moth-eye structure on the upper surface of the cover glass 3, an effect of capable of suppressing the occurrence of flare and ghost is achieved.

In the embodiment described above, an example in which the moth-eye structure is adopted on the upper surface of the cover glass 3 has been described, but the moth-eye structure is not limited to being provided on the upper surface of the cover glass 3, and may be provided on the lower surface of the cover glass 3. Furthermore, the moth-eye structure may be provided on both the upper surface and the lower surface of the cover glass 3.

Furthermore, as for the moth-eye structure in the embodiment illustrated in FIG. 10, an example of the shape of the minute protrusions 30 has been described in which the plurality of isosceles triangles having acute angles at their apexes are arranged in the lateral direction, but the cross section is not limited to a substantially isosceles triangle, and may have a substantially spindle shape or a cylindro-conical shape, or may be substantially trapezoidal, or sinusoidal. By forming in such a shape, the refractive index illustrated in FIG. 10B can be changed not only linearly from 1 to n but also changed curvilinearly.

Figure 14:
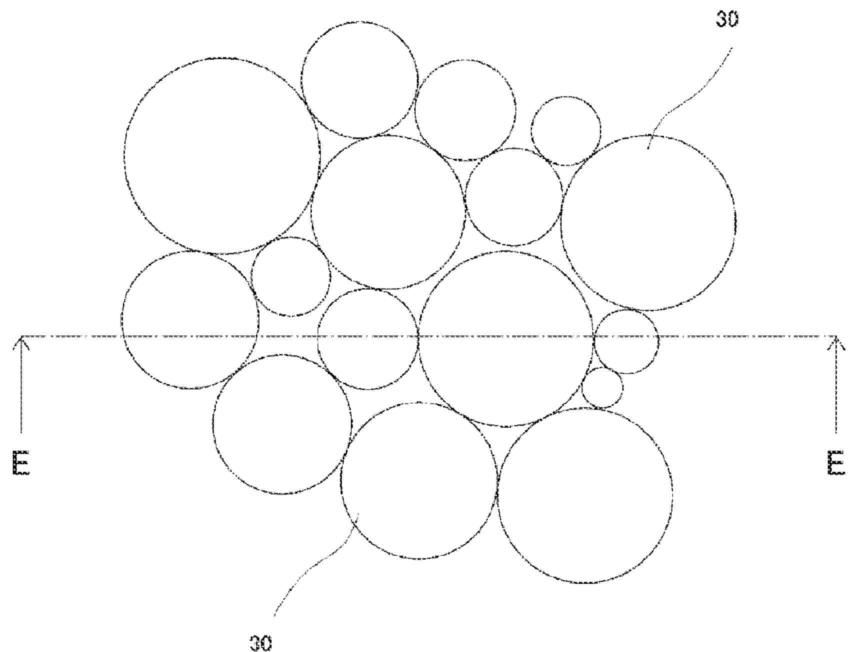
FIG. 14 is a plan view illustrating a surface structure of a second embodiment of a cover glass having a moth-eye structure.

Furthermore, the plurality of minute protrusions 30 formed on the surface of the cover glass 3 are desirably not uniform in size but irregular as illustrated in the plan view of FIG. 14. This is because the refractive index is not uniformly changed but is changed in various ways by making the minute protrusions 30 irregular, and therefore, light is less likely to be reflected with respect to a wavelength in a wide frequency band.

Furthermore, the minute protrusions 30 may be irregularly arranged. This is because the refractive index is not uniformly changed but is changed in various ways by irregularly arranging the minute protrusions 30, and therefore, light is less likely to be reflected with respect to a wavelength in a wide frequency band.

Furthermore, the minute protrusions 30 having various shapes may be mixed and arranged.

4. Second Embodiment of Solid-State Imaging Device Having Flare Prevention Structure In the first embodiment described above, it has been described that the moth-eye structure is provided on the upper surface, the lower surface, or both surfaces of the cover glass 3 as a measure for suppressing the occurrence of flare and ghost. In a second embodiment, in addition to or without the first embodiment, the resin 4 disposed between the microlens array 23 and the cover glass 3 includes a low refractive index material.

FIG. 15 is a schematic outline cross-sectional view for explaining reflection of light incident on a solid-state imaging device 1 according to the second embodiment. In the drawing, when the incident light H incident on the solid-state imaging device 1 is applied to the light receiving portion 21, the incident light H is reflected by a hemispherical surface of the microlens 23 of the light receiving portion 21 in a direction different from the incident angle of the incident light H, becomes the reflected light X, and travels in the resin 4 in the direction of the cover glass 3. Then, when the light reaches a boundary surface between the resin 4 and the cover glass 3, the light is reflected by the boundary surface between the resin 4 and the cover glass 3, becomes the reflected light X, and travels in the cover glass 3 because the refractive index of the cover glass 3 is larger than the refractive index of the resin 4. Then, when the reflected light X reaches a boundary surface of the upper surface 3*b* of the cover glass 3 with the air, the reflected light X is totally reflected, and this time, the reflected light X becomes the re-reflected light Y and travels in the direction of the resin 4. Then, when the re-reflected light Y reaches a boundary surface of the lower surface 3*c* of the cover glass 3 with the resin 4, the re-reflected light Y is totally reflected again and becomes the re-reflected light Y because the refractive index of the cover glass 3 is larger than the refractive index of the resin 4.

When the reflected light X is incident into the cover glass 3 in this manner, total reflection is repeated in the cover glass 3, and therefore, the re-reflected light Y does not return to the light receiving portion 21. As described above, the occurrence of flare and ghost can be suppressed by using the resin 4 having a refractive index smaller than the refractive index of the cover glass 3. In this manner, by forming the resin 4 using a material having a low refractive index, the resin 4 like the air having a small refractive index is interposed between the cover glass 3 and the light receiving portion 21, which is equivalent to providing a cavity that is the void 5.

Furthermore, by forming the surface of the cover glass 3 with the moth-eye structure and further forming the resin 4 using a low refractive index material, it is possible to obtain an effect of further suppressing the occurrence of flare and ghost. It goes without saying that this effect becomes more remarkable as the value of the refractive index of the low refractive index material of the resin 4 is smaller.

5. First Embodiment of Method for Manufacturing Cover Glass Having Moth-Eye Structure Next, a method for manufacturing the cover glass 3 having the moth-eye structure will be described. First, the cover glass 3 is prepared. Next, as illustrated in FIG. 16A, single particles 50 are substantially uniformly scattered on the upper surface of the cover glass 3 to form a single-particle film 51.

Next, as illustrated in FIG. 16B, the cover glass 3 configured such that the single-particle film 51 serves as an etching mask is subjected to surface processing by vapor phase etching (etching step). By performing vapor phase etching in this manner, a large number of the minute protrusions 30 having a cone shape can be formed on the upper surface of the cover glass 3. Specifically, as illustrated in FIG. 16B, when the vapor phase etching is started, an etching gas passes through a gap between the single particles 50 constituting the single-particle film 51 and reaches the surface of the cover glass 3, and a portion not in contact with each of the single particles 50 is etched. As a result, a V-shaped recess is formed in the portion not in contact with each of the single particles 50, and a truncated conical protrusion 31 appears at a position corresponding to each of the single particles 50.

Figure 17C:
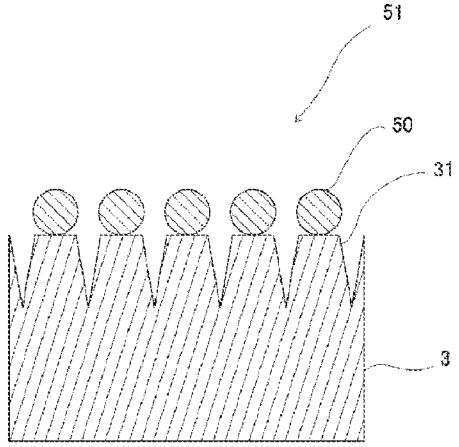
FIGS. 17C and 17D are cross-sectional views for explaining steps of the first embodiment of the method for manufacturing the cover glass having the moth-eye structure (part 2).

As illustrated in FIG. 17C, when the vapor phase etching is further continued, the single particle 50 on the apex of each of the truncated conical protrusions 31 is also etched gradually and becomes small, and at the same time, the V-shaped recess between the truncated conical protrusions 31 formed on the cover glass 3 becomes deeper.

Figure 17D:
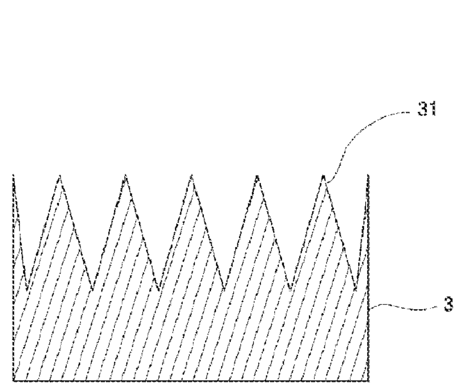

Then, finally, each of the single particles 50 disappears by vapor phase etching as illustrated in FIG. 17D, and at the same time, a large number of the minute protrusions 30 having a cone shape are formed on the surface of the cover glass 3.

By adopting the manufacturing process described above, the cover glass 3 having the moth-eye structure used for the solid-state imaging device 1 can be produced.

6. Second Embodiment of Method for Manufacturing Cover Glass Having Moth-Eye Structure In the embodiment illustrated in FIGS. 16 to 17 described above, the single particles 50 have been described as having substantially the same size. However, the single particles 50 are not limited to those having substantially the same size. For example, different-sized single particles 50 having an average particle size of 3 to 380 nm are mixed, and the mixed single particles are scattered on the upper surface of the cover glass 3 to form the single-particle film 51. In this case, the pitch is larger than or equal to 380 nm (less than or equal to the wavelength of visible light), the height is larger than or equal to 152 nm (larger than or equal to 0.4 times a target wavelength), and the aspect ratio of the recess is larger than or equal to 1.

When the single-particle film 51 is formed in this manner, a gap between the large single particles 50 is widened, and therefore, an etching gas easily passes. On the other hand, since a gap between the small single particles 50 is narrowed, the etching gas is less likely to pass. As a result, the progress of vapor phase etching is fast at a portion where the gap is wide, and conversely, the progress of vapor phase etching is slow at a portion where the gap is narrow. Therefore, the V-shaped recess is formed wide and deep at the portion where the progress of vapor phase etching is fast. On the other hand, the V-shaped recess is formed narrow and shallow at the portion where the progress of vapor phase etching is slow.

Figure 18A:
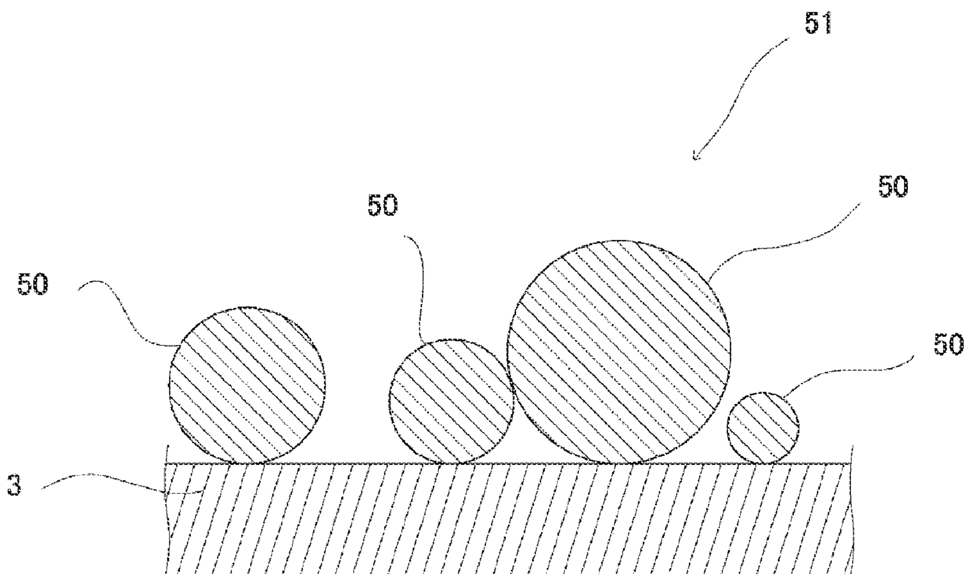
FIGS. 18A and 18B are cross-sectional views for explaining steps of a second embodiment of a method for manufacturing a cover glass having a moth-eye structure (part 1).

Hereinafter, a second embodiment of a method for manufacturing the cover glass 3 having the moth-eye structure will be specifically described. First, the cover glass 3 is prepared. Next, as illustrated in FIG. 18A, which is viewed in the direction of arrows E-E in FIG. 14, the single particles 50 having irregular particle sizes are substantially uniformly scattered on the upper surface of the cover glass 3 to form the single-particle film 51.

Figure 18B:
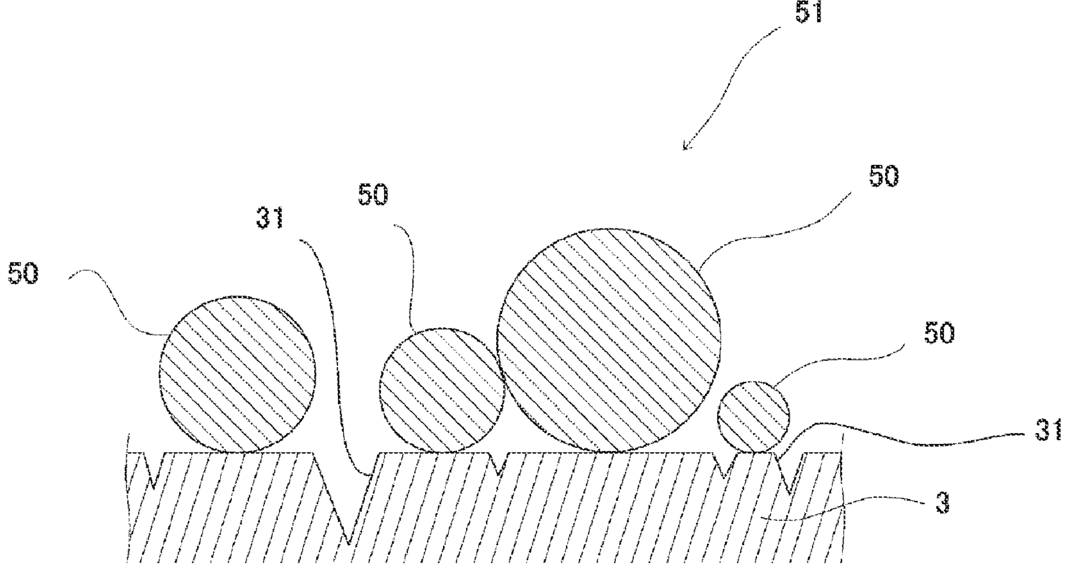

Next, as illustrated in FIG. 18B, the cover glass 3 configured such that the single-particle film 51 serves as an etching mask is subjected to surface processing by vapor phase etching (etching step). By performing vapor phase etching in this manner, a large number of the minute protrusions 30 having irregular sizes and a cone shape can be formed on the upper surface of the cover glass 3.

Specifically, as illustrated in FIG. 18B, when the vapor phase etching is started, an etching gas passes through the gap between the single particles 50 constituting the single-particle film 51 and reaches the surface of the cover glass 3, and a portion not in contact with each of the single particles 50 is etched. In this case, since a gap between the large single particles 50 is widened, the etching gas easily passes. On the other hand, since a gap between the small single particles 50 is narrowed, the etching gas is less likely to pass. As a result, a V-shaped recess is formed in the portion not in contact with each of the single particles 50, and the truncated conical protrusions 31 having irregular sizes appear at positions corresponding to the single particles 50.

Figure 19C:
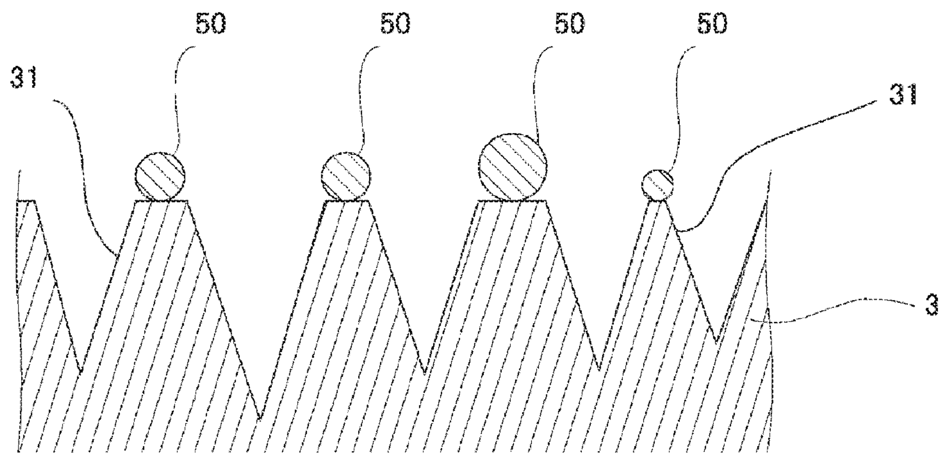
FIGS. 19C and 19D are cross-sectional views for explaining steps of the second embodiment of the method for manufacturing the cover glass having the moth-eye structure (part 2).

As illustrated in FIG. 19C, when the vapor phase etching is further continued, the single particle 50 on the apex of each of the truncated conical protrusions 31 is also etched gradually and becomes small, and at the same time, the V-shaped recess between the truncated conical protrusions 31 formed on the cover glass 3 becomes further deeper.

Figure 19D:
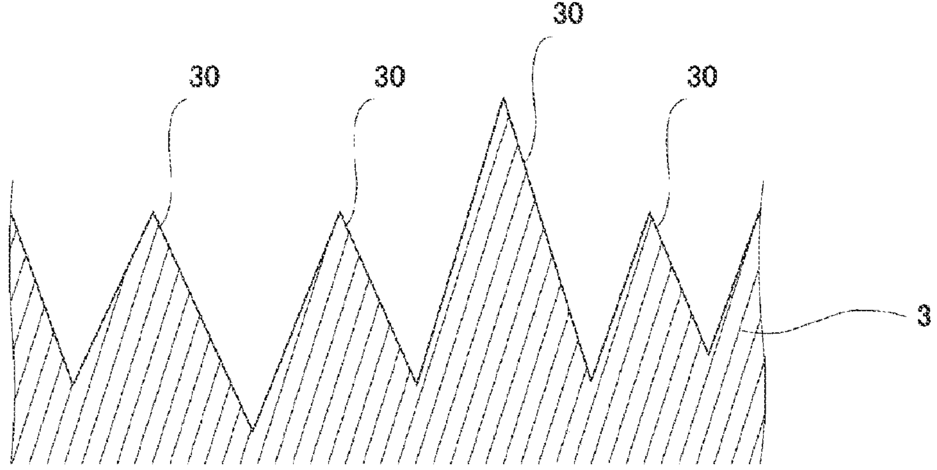

Then, finally, as illustrated in FIG. 19D, each of the single particles 50 disappears by vapor phase etching, and at the same time, a large number of the minute protrusions 30 having irregular sizes and a cone shape are formed on the surface of the cover glass 3.

By adopting the manufacturing process described above, the cover glass 3 having the moth-eye structure used for the solid-state imaging device 1 can be produced.

In this manner, in a case where the single-particle film 51 is configured by mixing the single particles 50 having different sizes and scattering the mixed single-particles on the upper surface of the cover glass 3 and vapor phase etching is performed, a large number of the irregular minute protrusions 30 having different heights and sizes and having a cone shape are formed on the upper surface of the cover glass 3. By forming the uneven minute protrusions 30 having a cone shape in this manner, it is possible to exhibit an effect of suppressing reflection even for light having a wide wavelength band.

The reflection of light is caused by an abrupt change in the refractive index of an incident surface. Therefore, if there is a structure in which the refractive index continuously and smoothly changes at a boundary where light is incident, the incident light H is not reflected finally. Therefore, by setting the height of the minute protrusions 30 to a size equal to or less than the wavelength of visible light as described above, the reflection of the incident light H can be reduced to almost 0.

In the solid-state imaging device 1 according to the present embodiment, the upper surface of the cover glass 3 forms the moth-eye structure with the minute protrusions 30 having a cone shape formed thereon. By forming the moth-eye structure, the reflected light X can be transmitted into the air at the upper surface 3*b* of the cover glass 3, and can be prevented from being re-reflected in the direction of the light receiving portion 21 of the solid-state imaging device 1. As a result, the re-reflected light Y that causes the occurrence of flare and ghost is not applied to the light receiving portion 21. In this manner, the occurrence of flare and ghost can be suppressed.

Conventionally, as measures for suppressing the occurrence of flare and ghost in the solid-state imaging device 1, there are a method of stacking antireflection films on the upper surface side and the lower surface side of the cover glass 3 (the first control film 24 and the second control film 25 in FIG. 4), a method of attaching an antireflection filter to the upper surface of the cover glass 3, a method of processing the microlens array 23 into an uneven shape, and the like, but there are many restrictions and versatility is low. The present disclosure is a method in which powdery fine particles are sprayed on the upper surface of the flat cover glass 3 and processing is performed using the sprayed particles as a mask for vapor phase etching. In the future, even when the miniaturization or height reduction of the solid-state imaging device 1 progresses, the manufacturing method according to the present disclosure is an effective manufacturing method.

Through the above steps, the cover glass 3 having the moth-eye structure can be manufactured, and accordingly, the solid-state imaging device 1 having the cavity-less CSP structure can be manufactured.

7. Configuration Example of Electronic Apparatus Having Solid-State Imaging Device A configuration example of an electronic apparatus having the solid-state imaging device 1 according to the embodiment described above will be described with reference to FIG. 20. Note that this configuration example is common to the first embodiment or the second embodiment of the solid-state imaging device 1 having the flare prevention structure.

The solid-state imaging device 1 is applicable to all electronic apparatuses using the solid-state imaging device 1 for an image capturing unit (photoelectric conversion unit), such as an imaging device such as a digital still camera or a video camera, a mobile terminal device having an imaging function, and a copy machine using the solid-state imaging device 1 for an image reading unit. The solid-state imaging device 1 may be formed as one chip, or may be in the form of a module having an imaging function in which an imaging unit and a signal processing unit or an optical system are packaged together.

Figure 20:
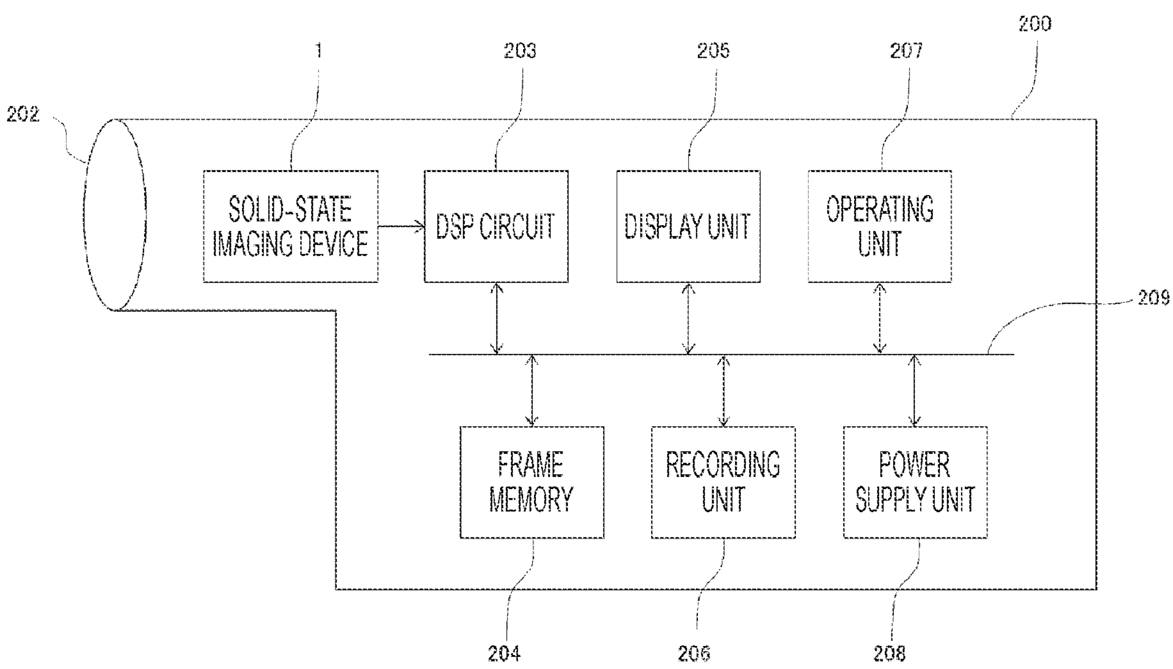
FIG. 20 is a block diagram illustrating a configuration example of an electronic apparatus including the solid-state imaging device according to the present disclosure.

As illustrated in FIG. 20, an imaging device 200 as an electronic apparatus includes an optical unit 202, the solid-state imaging device 1, a digital signal processor (DSP) circuit 203, which is a camera signal processing circuit, a frame memory 204, a display unit 205, a recording unit 206, an operating unit 207, and a power supply unit 208. The DSP circuit 203, the frame memory 204, the display unit 205, the recording unit 206, the operating unit 207, and the power supply unit 208 are connected to one another through a bus line 209.

The optical unit 202 includes a plurality of lenses, and captures incident light (image light) H from a subject to form an image on the pixel region PA of the solid-state imaging device 1. The solid-state imaging device 1 converts a light amount of the incident light H formed as an image on the pixel region PA by the optical unit 202 into an electric signal in units of the pixels 22 and outputs the electric signal as a pixel signal.

The display unit 205 includes, for example, a panel type display device such as a liquid crystal panel or an organic electro luminescence (EL) panel, and displays a moving image or a still image captured by the solid-state imaging device 1. The recording unit 206 records the moving image or the still image captured by the solid-state imaging device 1 on a recording medium such as a hard disk or a semiconductor memory.

The operating unit 207 issues operation commands for various functions of the imaging device 200 under operation by a user. The power supply unit 208 appropriately supplies various power sources serving as operation power sources of the DSP circuit 203, the frame memory 204, the display unit 205, the recording unit 206, and the operating unit 207 to these supply targets.

According to the imaging device 200 described above, by using the solid-state imaging device 1 according to the present disclosure, the moth-eye structure including the minute protrusions 30 or the resin 4 having a low refractive index prevents the occurrence of flare and ghost, and therefore, it is possible to prevent a phenomenon in which a part or the entire imaged image becomes whitish, a phenomenon in which the resolution of the entire image decreases, or a phenomenon in which light appears as a ring of light or in the form of a ball so that it is possible to obtain a high-quality captured image.

Finally, the description of each of the above-described embodiments is an example of the present disclosure, and the present disclosure is not limited to the above-described embodiments. For this reason, it is needless to say that various modifications other than the above-described embodiments can be made according to the design and the like without departing from the technical idea according to the present disclosure. Furthermore, the effects described in the present specification are merely examples and are not limited, and other effects may be further provided.

Note that the present technology can also have the following configurations.

(1)

A solid-state imaging device including:

a sensor substrate in which a plurality of pixels that receives incident light and converts the incident light into an electric signal is arranged;

a semiconductor substrate having an upper surface on which the sensor substrate is mounted, the semiconductor substrate being configured to be able to connect the electric signal converted by the pixel to a bump or an external connection terminal disposed on a lower surface;

a microlens array disposed on an upper surface of the sensor substrate so as to correspond to each of the pixels;

a resin disposed on an upper surface of the microlens array; and a cover glass bonded to the microlens array via the resin and having a moth-eye structure formed on a surface of the cover glass.

(2)

The solid-state imaging device according to (1), in which the resin includes a low refractive index material.

(3)

The solid-state imaging device according to (1), in which a color filter and an absorption type infrared cut filter are disposed between the semiconductor substrate and the microlens array.

(4)

The solid-state imaging device according to (1), in which the moth-eye structure formed on the surface of the cover glass has a plurality of minute protrusions formed on the surface of the cover glass and arranged on an upper surface of the cover glass.

(5)

The solid-state imaging device according to (4), in which the minute protrusions are irregular in size and irregularly arranged.

(6)

The solid-state imaging device according to (4), in which the minute protrusions are arranged in a size of (1/1.6)λ(240 nm) or less in a visible light wavelength region.

(7)

The solid-state imaging device according to (1), in which upper surfaces of the plurality of minute protrusions formed on the surface of the cover glass are covered with a thin film for preventing breakage.

(8)

A method for manufacturing a cover glass having a moth-eye structure, the method including:

a step of substantially uniformly scattering single particles having a uniform particle size or irregular particle sizes on an upper surface of a cover glass to form a single-particle film; and a step of forming a large number of minute protrusions having a uniform size or irregular sizes on the upper surface of the cover glass by performing vapor phase etching on the cover glass using the single-particle film as an etching mask.

(9)

An electronic apparatus including a solid-state imaging device including:

a sensor substrate in which a plurality of pixels that receives incident light and converts the incident light into an electric signal is arranged;

a semiconductor substrate having an upper surface on which the sensor substrate is mounted, the semiconductor substrate being configured to be able to connect the electric signal converted by the pixel to a bump or an external connection terminal disposed on a lower surface;

a microlens array disposed on an upper surface of the sensor substrate so as to correspond to each of the pixels;

a resin disposed on an upper surface of the microlens array; and a cover glass bonded to the microlens array via the resin and having a moth-eye structure formed on a surface of the cover glass.

REFERENCE SIGNS LIST

1 Solid-state imaging device
2 Optical sensor
3 Cover glass
4 Resin
5 Void
6 Semiconductor substrate
7 Bump
8 Sealing resin
9 Thin film
10 Sensor substrate
11 Color filter
12 Infrared cut filter
21 light receiving portion
22 Pixel
23 Microlens array
24 First control film
25 Second control film
30 Minute protrusion
31 Truncated conical protrusion
40 Camera
42 Optical system
43 Control unit
44 Signal processing unit
50 Single particle
51 Single-particle film
200 Imaging device
PA Pixel region
SA Peripheral region
H Incident light
X Reflected light
Y Re-reflected light
Z Transmitted light

The invention claimed is:

1. A solid-state imaging device, comprising:

a sensor substrate in which a plurality of pixels that receives incident light and converts the incident light into an electric signal is arranged;

a semiconductor substrate having an upper surface on which the sensor substrate is mounted, the semiconductor substrate being configured to be able to connect the electric signal converted by the pixel to a bump or an external connection terminal disposed on a lower surface;

a microlens array disposed on an upper surface of the sensor substrate so as to correspond to each of the pixels;

a resin disposed on an upper surface of the microlens array; and a cover glass bonded to the microlens array via the resin and having a moth-eye structure formed on a surface of the cover glass, wherein a refractive index of the resin is lower than a refractive index of the cover glass.

2. The solid-state imaging device according to claim 1, wherein a color filter and an absorption type infrared cut filter are disposed between the semiconductor substrate and the microlens array.

3. The solid-state imaging device according to claim 1, wherein the moth-eye structure formed on the surface of the cover glass has a plurality of minute protrusions formed on the surface of the cover glass and arranged on an upper surface of the cover glass.

4. The solid-state imaging device according to claim 3, wherein the plurality of minute protrusions is irregular in size and irregularly arranged.

5. The solid-state imaging device according to claim 3, wherein the plurality of minute protrusions is arranged with a pitch less than or equal to (1/1.6) times a wavelength of 240 nm.

6. The solid-state imaging device according to claim 3, wherein each minute protrusion of the plurality of minute protrusions has a triangular pyramid shape.

7. The solid-state imaging device according to claim 3, wherein each minute protrusion of the plurality of minute protrusions has a height of 200 nm to 250 nm.

8. The solid-state imaging device according to claim 3, wherein the plurality of minute protrusions is formed of isosceles triangles having acute angles at respective apexes.

9. The solid-state imaging device according to claim 3, wherein upper surfaces of the plurality of minute protrusions formed on the surface of the cover glass are covered with a thin film for preventing breakage.

10. A method for manufacturing a cover glass having a moth-eye structure, the method comprising:

a step of forming a resin between a microlens array and a cover glass;

a step of substantially uniformly scattering single particles having a uniform particle size or irregular particle sizes on an upper surface of the cover glass to form a single-particle film; and a step of forming a plurality of minute protrusions having a uniform size or irregular sizes on the upper surface of the cover glass by performing vapor phase etching on the cover glass using the single-particle film as an etching mask, wherein a refractive index of the resin is lower than a refractive index of the cover glass.

11. An electronic apparatus, comprising:

an optical system;

a solid-state imaging device that receives light from the optical system, the solid-state imaging device including:

a sensor substrate in which a plurality of pixels that receives incident light and converts the incident light into an electric signal is arranged;

a semiconductor substrate having an upper surface on which the sensor substrate is mounted, the semiconductor substrate being configured to be able to connect the electric signal converted by the pixel to a bump or an external connection terminal disposed on a lower surface;

a microlens array disposed on an upper surface of the sensor substrate so as to correspond to each of the pixels;

a resin disposed on an upper surface of the microlens array; and a cover glass bonded to the microlens array via the resin and having a moth-eye structure formed on a surface of the cover glass, wherein a refractive index of the resin is lower than a refractive index of the cover glass; and a digital signal processor that processes signals received from the solid-state imaging device.

12. The electronic apparatus according to claim 11, wherein a color filter and an absorption type infrared cut filter are disposed between the semiconductor substrate and the microlens array.

13. The electronic apparatus according to claim 11, wherein the moth-eye structure formed on the surface of the cover glass has a plurality of minute protrusions formed on the surface of the cover glass and arranged on an upper surface of the cover glass.

14. The electronic apparatus according to claim 13, wherein the plurality of minute protrusions is irregular in size and irregularly arranged.

15. The electronic apparatus according to claim 13, wherein the plurality of minute protrusions is arranged with a pitch less than or equal to (1/1.6) times a wavelength of 240 nm.

16. The electronic apparatus according to claim 13, wherein each minute protrusion of the plurality of minute protrusions has a triangular pyramid shape.

17. The electronic apparatus according to claim 13, wherein each minute protrusion of the plurality of minute protrusions has a height of 200 nm to 250 nm.

18. The electronic apparatus according to claim 13, wherein the plurality of minute protrusions is formed of isosceles triangles having acute angles at respective apexes.

19. The electronic apparatus according to claim 13, wherein the plurality of minute protrusions is formed of a spindle shape, a cylindroconical shape, a trapezoidal shape or a sinusoidal shape.

20. The electronic apparatus according to claim 13, wherein upper surfaces of the plurality of minute protrusions formed on the surface of the cover glass are covered with a thin film for preventing breakage.

* * * * *